(12) United States Patent
Hiramatsu

(10) Patent No.: US 6,430,716 B1
(45) Date of Patent: Aug. 6, 2002

(54) METHOD FOR WRITING DATA INTO NON-VOLATILE MEMORY IN VEHICLE ELECTRONIC UNIT

(75) Inventor: Shinya Hiramatsu, Nagoya (JP)

(73) Assignees: Autonetworks Technologies, Ltd., Nagoya; Sumitomo Wiring Systems, Ltd., Mie; Sumitomo Electric Industries, Ltd., Nagoya, all of (JP)

( * ) Notice: Subject to any disclaimer, the term of this patent is extended or adjusted under 35 U.S.C. 154(b) by 0 days.

(21) Appl. No.: 09/392,731

(22) Filed: Sep. 9, 1999

(30) Foreign Application Priority Data

Jan. 8, 1999 (JP) .......................................... 11-003230

(51) Int. Cl.7 .............................................. G11C 29/00
(52) U.S. Cl. .................................... 714/718; 701/29
(58) Field of Search ............................ 714/718; 701/29

(56) References Cited

U.S. PATENT DOCUMENTS

| | | |
|---|---|---|
| 5,278,759 A | 1/1994 | Berra et al. |
| 5,739,761 A | 4/1998 | Kobayashi |
| 5,787,381 A | 7/1998 | Sasaki |
| 6,226,574 B1 * | 5/2001 | Hiramatsu ................... 701/29 |

FOREIGN PATENT DOCUMENTS

| | | |
|---|---|---|
| DE | 34 43 997 A1 | 6/1986 |
| DE | 42 38 539 A1 | 5/1994 |
| EP | 0 214 451 | 3/1987 |

* cited by examiner

Primary Examiner—Phung M. Chung
(74) Attorney, Agent, or Firm—Oliff & Berridge, PLC

(57) ABSTRACT

A method for writing data into a non-volatile memory employed in an on-vehicle electronic unit, in that while presently available input circuits 11 to 16 are directly utilized without newly setting an exclusively used interface circuit on the side of an electronic unit 3, such data which is desired to be written into the non-volatile memory 6 is entered into the electronic unit 3. A confirmation is made as to whether or not the data writing operation is carried out under normal condition based upon an output signal derived from a presently available output circuit 18.

2 Claims, 4 Drawing Sheets

METHOD FOR WRITING DATA INTO NON-VOLATILE MEMORY IN VEHICLE ELECTRONIC UNIT

BACKGROUND OF THE INVENTION

The present invention is related to a method for writing data into a writable non-volatile memory such as an EEPROM provided in an electronic unit mounted on an automobile.

Conventionally, as to tests performed when on-vehicle electronic units on which writable non-volatile memories such as EEPROMs are mounted are shipped, there are few cases that data are written into these non-volatile memories in order to test various functions and various circuits employed in the on-vehicle electronic units. The major reason is given as follows. Originally, there are many cases that data input means cannot be connected to input terminals of these on-vehicle electronic units. Generally speaking, only switches are connected to the input terminals of the on-vehicle electronic units. These switches are constituted by door locking switches, and switches used to powered door windows for instructing that door windows ascend and/or descend. It is practically difficult to write certain data into non-volatile memories by using these switches.

However, in such electronic units assembled in on-vehicle LANs, arbitrary data may be written into non-volatile memories via communication input interfaces of these electronic units by way of serial communications.

FIG. 8 is a schematic block diagram for showing a method for writing data into a non-volatile memory employed in an electronic unit assembled in an on-vehicle LAN. In this on-vehicle LAN, a serial communication interface (I/F) 2 of a test apparatus 1 is connected to an on-vehicle LAN input/output circuit 4 of an on-vehicle electronic unit 3, and arbitrary data outputted from the test apparatus 1 is supplied to a microcomputer chip (simply referred to as a "microcomputer" hereinafter) 5 employed in the electronic unit 3 via the on-vehicle LAN input/output circuit 4. Then, in the microcomputer 5, the acquired data is stored into a non-volatile memory 6 such as an EEPROM provided within this microcomputer 5.

As previously described, if such an electronic unit 3 applied to the on-vehicle LAN is indicated in FIG. 8 is available, then the arbitrary data can be stored into the non-volatile memory 6 by employing the on-vehicle LAN input/output circuit 4 while utilizing the serial communicating method. However, practically speaking, the electronic unit 3 itself applicable to the on-vehicle LAN is not so popular. As a consequence, when the arbitrary data is tried to be stored from the test apparatus 1 into the non-volatile memory 6 employed in the electronic unit 3 which is not applicable to such an on-vehicle LAN, an interface circuit exclusively used to this type of electronic unit 3 is newly required. In this specific case, there are problems that this electronic unit 3 would become large scale and would require high cost.

SUMMARY OF THE INVENTION

The present invention has been made to solve these problems, and therefore, has an object to provide a method for readily writing arbitrary data into a non-volatile memory employed in an on-vehicle electronic unit. That is, the data writing method for the non-volatile memory is realized while avoiding a bulky electronic unit and also an increase of manufacturing cost of the electronic unit.

To solve the above-described problems, a data writing method of the present invention, is featured by that in a method for writing data into a non-volatile memory employed in an on-vehicle electronic unit equipped with a plurality of input circuits containing a control circuit having a non-volatile memory and connected to a plurality of external switches, into which operation signals of the respective external switches are entered; a plurality of output circuits for outputting predetermined output signals to an external unit; and a control unit for controlling the respective output signals derived from the plural output circuits in response to the respective operation signals entered via the plural input circuits, in which a predetermined test apparatus is connected to the on-vehicle electronic unit so as to test the electronic unit mounted on a vehicle, the data writing method is comprised of: a first step for outputting a specific input signal with respect to the existing input circuits of the electronic unit from the test apparatus so as to switch an operation mode of the control circuit employed in the electronic unit to a data writing mode for writing the data into the non-volatile memory; a second step for outputting a predetermined write instruction command to the input circuits from the test apparatus when the control circuit is operated in the data writing mode; a third step for transmitting arbitrary data subsequent to the write instruction command from the test apparatus to the input circuits, the arbitrary data being wanted to be written into the non-volatile memory employed in the electronic unit; and a fourth step for confirming as to whether or not the data is written into the non-volatile memory employed in the electronic unit in response to the write instruction command in the test apparatus based upon the output signals derived from the output circuits after the third step.

Preferably, according to the data writing method of the present invention, the first step to the fourth step are executed when the electronic unit is shipped.

DETAILED DESCRIPTION OF THE PREFERRED EMBODIMENTS

Figure 1:
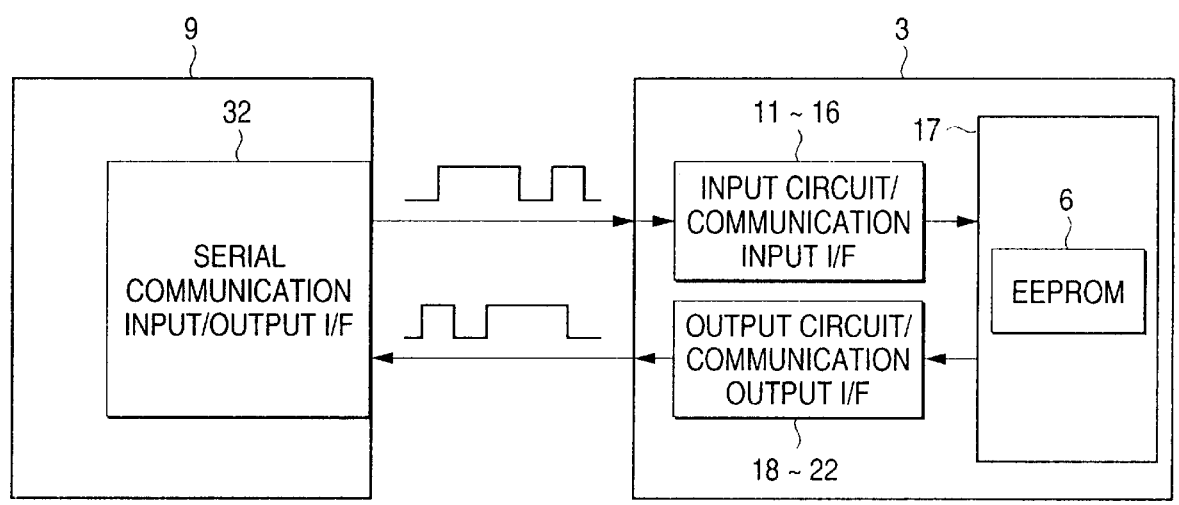
FIG. 1 is a schematic block diagram for showing a method for writing data into a non-volatile memory employed in an on-vehicle electronic unit, according to an embodiment of the present invention.

FIG. 1 is a diagram for representing an on-vehicle electronic unit 3 according to an embodiment mode of the present invention, and a test apparatus 9. It should be noted that the same reference numerals used in the conventional electronic unit will be employed as those for denoting the same, or similar elements in FIG. 1. This method for writing data into a non-volatile memory employed in an on-vehicle electronic unit is carried out as follows. As to an electronic unit which does not mount an on-vehicle LAN, as shown in FIG. 1, while using input circuits 11 to 16 and output circuits 18 to 22, which are presently provided in this electronic unit 3, a serial communication is performed between this electronic unit 3 and the test apparatus 9 so as to test the electronic unit 3.

Figure 2:
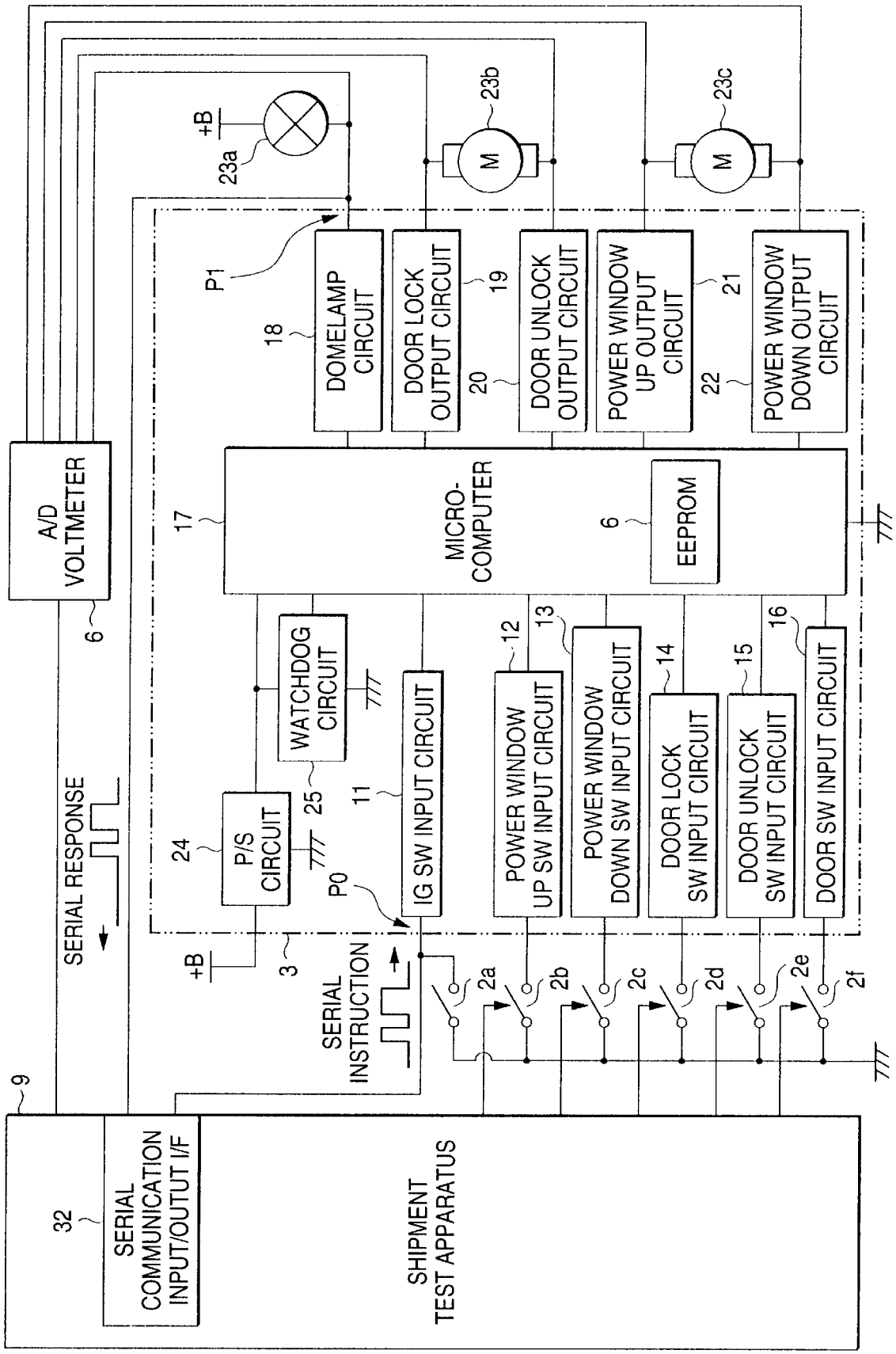
FIG. 2 is a schematic block diagram for showing a method for writing data into a non-volatile memory employed in an on-vehicle electronic unit, according to an embodiment of the present invention.

Concretely speaking, as represented in FIG. 2, this electronic unit 3 drives loads such as a dome lamp 23a, a door locking motor 23b, and a powered window motor 23c by receiving individual switch operation signals. These switch operation signals are supplied from an ignition switch 2a, a powered window up switch 2b, a powered window down switch 2c, a door locking switch 2d, a door unlocking switch 2e, and a door switch 2f. The ignition switch 2a is connected to an ignition switch input circuit (IG-SW input circuit) 11 provided in the electronic unit 3. The powered window up switch 2b is connected to a powered window up switch input circuit (POWER-WINDOW-UP-SW input circuit) 12 employed in the electronic unit 3. The powered window down switch 2c is connected to a powered window down switch input circuit (POWER-WINDOW-DOWN-SW input circuit) 13 employed in the electronic unit 3. The door locking switch 2d is connected to a door locking switch input circuit (DOOR-LOCK-SW input circuit) 14 employed in the electronic unit 3. The door unlocking switch 2e is connected to a door unlocking switch input circuit (DOOR-UNLOCKING-SW input circuit) 15 provided in the electronic unit 3. Then, the door switch 2f is connected to a door switch input circuit (DOOR-SW input circuit) 16 employed in the electronic unit 3. Also, the signals which are acquired via these input circuits 11 to 16 are entered into a microcomputer (control circuit) 17 containing a ROM, a RAM, and a CPU. While a dome (ceiling) lamp circuit 18, a door locking output circuit 19, a door unlocking output circuit 20, a powered window up output circuit 21, and a powered window down output circuit 22 are controlled by this microcomputer 17, these output circuits 18 to 22 are operated, so that the dome lamp 23a, the door locking motor 23b, and the powered window motors 23c are driven, respectively. It should be understood that in FIG. 2, reference numeral 24 denotes a power supply circuit, and reference numeral 25 represents a watch dog circuit for testing a power supply level.

Then, a junction point (port) P0 between the ignition switch 2a and the ignition switch input circuit 11 is connected to a serial communication input/output interface 32 of the test apparatus 9. A serial communication signal transmitted from this test apparatus 9 is entered via the ignition switch input circuit 11 to the microcomputer 17.

The test apparatus 9 is equipped with a serial communication input/output interface (serial communication input/output interface I/F) 32. This test apparatus 9 contains a function for issuing an instruction capable of switching the operation mode of the microcomputer 17 of the electronic unit 3 into a "data writing mode" in which data is written into the non-volatile memory 6 in response to a serial communication signal; and another function for outputting write instruction commands ID1a and ID2a (See FIG. 3 and FIG. 4) contained in the serial communication signal to the electronic unit 3 when the microcomputer 17 is operated in "data writing mode". The test apparatus 9 further contains a function for transmitting arbitrary data subsequent to the above-explained write instruction commands ID1a and ID2a, which is desired to be written into the non-volatile memory 6; and another function for receiving the output signals derived from these output circuits 18 to 22 when the test apparatus 9 is connected to the respective output circuits 18 to 22 of the electronic unit 3; and furthermore, another function for confirming as to whether or not the data is written into the non-volatile memory 6 employed in the electronic unit 3 in response to the above-explained write instruction commands ID1a and ID2a based upon the output signals derived from the output circuits 18 to 22. It should be noted that both the write instruction commands and the arbitrary data which is desired to be written into the non-volatile memory 6 will be referred to as an "instruction frame" (see FIG. 3, tables 1 and 2) in the below-mentioned description. It is so assumed that in response to this instruction frame, process operations executed in the electronic unit 3 are reported/returned to the test apparatus 9, and then, a signal reported/returned to the test apparatus will be referred to a "response frame" (see FIG. 5, tables 3 and 4).

As the serial communication system executed between the test apparatus 9 and the electronic unit 3, a specific combination protocol of such a serial communication system is employed in which the test apparatus 9 is used as a master unit and the electronic unit 3 is used as a slave unit. Basically, the below-mentioned communication system is employed. That is, first, a write instruction command is sent from the test apparatus 9 to the electronic unit 3, and upon receipt of this write instruction command, the electronic unit 3 waits for data. Subsequently, after the data sent from the test apparatus 9 has been stored into the non-volatile memory 6, the electronic unit 5 returns a response frame indicative of this fact to the test apparatus 9. At this time, the electronic unit 3 receives an instruction frame via the presently available input circuits 11 to 16, and transmits a response frame corresponding this instruction frame by using the presently available output circuits 18 to 22. The above-explained operation is executed in accordance with a software program dedicated to the test purpose, which is prepared in the microcomputer 17 employed in the electronic unit 3.

It should be noted that this test apparatus 9 is originally intended to test as to whether or not the operations of the respective input circuits 11 to 16 and the respective output circuits 18 to 22 employed in the electronic unit 3 are carried out under normal conditions. Practically speaking, the serial communication input/output interface 32 is also connected not only to the junction point P0 between the ignition switch 2a and the ignition switch input circuit 11, but also a junction point between the powered window up switch 2b and the powered window up switch input circuit 12; another junction point between the powered window down switch 2c and the powered window down switch input circuit 13 employed in the electronic unit 3; another junction point between the door locking switch 2d and the door locking switch input circuit 14 employed in the electronic unit 3; and another junction point between the door unlocking switch 2e and the door unlocking switch input circuit 15 employed in the electronic unit 3; and also, another junction point between the door switch 2f and the door switch input circuit 16 employed in the electronic unit 3. The signals similar to the normal operation signals derived from the respective switches 2a to 2f are transmitted to these junction points in order that the input circuits 11 to 16 and the output circuits 18 to 22 are tested. It should be noted these connection relationships are omitted from FIG. 2, for the sake of convenient.

Figure 3:
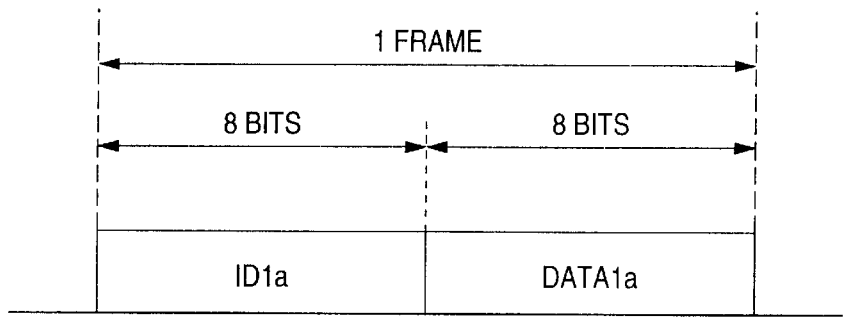
FIG. 3 is a diagram for representing an example of an instruction frame transmitted from a test apparatus to the electronic unit.

Next, a description will now be made of the serial communication protocol. First, as indicated in FIG. 3, the instruction frame sent from the test apparatus 9 to the electronic unit 3 is constituted by the write instruction command ID1*a* having an 8-bit length and indicative of a content of an instruction, and data DATA1*a* having an 8-bit length. This data DATA1*a* is used to designate an output port and an input port which is wanted to be read, and also is desired to be written into the non-volatile memory 6. In this case, a table 1 represents a list of the write instruction command ID1*a*, and a table 2 indicates a list of the data DATA1*a* which is desirably written into the non-volatile memory 6.

TABLE 1

| content of write data | ID1 | | | | | | | |
|---|---|---|---|---|---|---|---|---|
| | D7 | D6 | D5 | D4 | D3 | D2 | D1 | D0 |
| write serial No. | 0 | 0 | 0 | 0 | 0 | 0 | 0 | 0 |
| write test date | 0 | 0 | 0 | 0 | 0 | 0 | 0 | 1 |
| write test OK/NG result | 0 | 0 | 0 | 0 | 0 | 0 | 1 | 0 |
| request ending of write mode | 1 | 1 | 1 | 1 | 1 | 1 | 1 | 1 |

TABLE 2

| Serial No. | DATA1 | | | | | | | |
|---|---|---|---|---|---|---|---|---|
| | DAT7 | DAT6 | DAT5 | DAT4 | DAT3 | DAT2 | DAT1 | DAT0 |
| 0 | 0 | 0 | 0 | 0 | 0 | 0 | 0 | 0 |
| 1 | 0 | 0 | 0 | 0 | 0 | 0 | 0 | 1 |
| 2 | 0 | 0 | 0 | 0 | 0 | 0 | 1 | 0 |
| 255 | 1 | 1 | 1 | 1 | 1 | 1 | 1 | 1 |

Figure 4:
FIG. 4 is a diagram for showing another example of the instruction frame transmitted from the test apparatus to the electronic unit.
Figure 5:
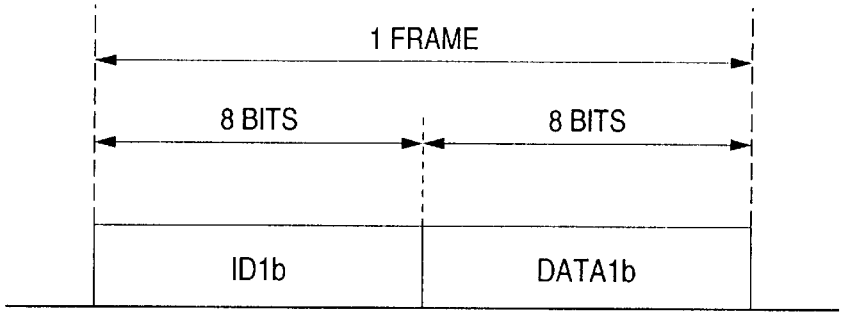
FIG. 5 is a diagram for representing an example of a response frame transmitted from the electronic unit to the test apparatus.
Figure 6:
FIG. 6 is a diagram for showing another example of the response frame transmitted from the electronic unit to the test apparatus.

In this table 1, symbols "D0" to "D7" indicate the respective bit data contained in the write instruction command ID1*a* which implies attributes (profiles) of write data. In the table 2, symbols "DAT0" to "DAT7" indicate the respective bit data contained in the data DATA1*a* which is wanted to be written into the non-volatile memory 6. In this case, an example of the table 2 corresponds to such an example that serial numbers applied to the respective products when the products are test/shipped are shown. In addition, test date/time, and test OK/NG results may be written into the non-volatile memory. As to the instruction commands and the data which are wanted to be written into the non-volatile memory 6, there are some possibilities that a total number of instructions is desirably increased and the data themselves are increased, depending upon the unit scale of the electronic unit 3. As a result, as illustrated in FIG. 4, another write instruction command ID2*a* and another data DATA2*a* desirably written into the non-volatile memory 6 may be added to the frame, if required.

Similar to the above-described instruction frame, the response frame supplied from the electronic unit 3 to the test apparatus 9 is constituted by response information ID1*b* having an 8-bit length and indicative of a content of a response; and also DATA1*b* having an 8-bit length and written into the non-volatile memory 6. In this case, a table 3 indicates a list of the response information ID1*b*, and another table 4 represents a list of the data DATA1*b* written into the non-volatile memory 6.

TABLE 3

| content of write data | ID1 | | | | | | | |
|---|---|---|---|---|---|---|---|---|
| | D7 | D6 | D5 | D4 | D3 | D2 | D1 | D0 |
| write serial No. | 0 | 0 | 0 | 0 | 0 | 0 | 0 | 0 |
| write test date | 0 | 0 | 0 | 0 | 0 | 0 | 0 | 1 |
| write test OK/NG result | 0 | 0 | 0 | 0 | 0 | 0 | 1 | 0 |
| request ending of write mode | 1 | 1 | 1 | 1 | 1 | 1 | 1 | 1 |

TABLE 3-continued

TABLE 4

| Serial No. | DATA1 | | | | | | | |
|---|---|---|---|---|---|---|---|---|
| | DAT7 | DAT6 | DAT5 | DAT4 | DAT3 | DAT2 | DAT1 | DAT0 |
| 0 | 0 | 0 | 0 | 0 | 0 | 0 | 0 | 0 |
| 1 | 0 | 0 | 0 | 0 | 0 | 0 | 0 | 1 |
| 2 | 0 | 0 | 0 | 0 | 0 | 0 | 1 | 0 |
| 255 | 1 | 1 | 1 | 1 | 1 | 1 | 1 | 1 |

It should be understood that symbols "D0" to "D7" shown in the table 3 indicate the respective bit data contained in the response information ID1*b*, and symbols "DAT0" to "DAT7" represent the respective bit data contained in the data DATA1*b* written into the non-volatile memory 6. In this case, the example of the table 3 corresponds to the example of the above-explained table 1, whereas the example of the table 4 corresponds to the example of the above-described table 2. It should also be noted that as shown in these tables 3 and 4, these data need not be identical to those of the tables 1 and 2.

It should further be noted that reference numeral "10" shown in FIG. 2 indicates an A/D voltmeter for detecting voltage levels appearing in the respective circuit portions to thereby transfer the detected voltage levels to the test apparatus 1.

Now, a description will be made of a method for writing data into the non-volatile memory 6 employed in the on-vehicle electronic unit with employment of the above-explained arrangement.

First of all, a commencement of the data writing mode to the non-volatile memory 6 is instructed to the electronic unit 3. In this case, a specific input is applied to the ignition switch input circuit 11 of the electronic unit 3 by way of the serial communication signal derived from the test apparatus 9. In this case, such a waveform signal having a constant complex pulse shape is applied to this ignition switch input circuit 11 in order not to confuse this specific input operation from the normal operation executed in the ignition switch 2*a*. Alternatively, such an operation signal corresponding to the simultaneous operations of the plural switches 2*a* to 2*f* may be inputted to the ignition switch input circuit 11. In this alternative example, the key input may be confirmed as a "specific input" in the case that a complex switch operation is carried out which is not actually carried out while driving the automobile, and then this complex switch operation produces such a specific signal.

Figure 7:
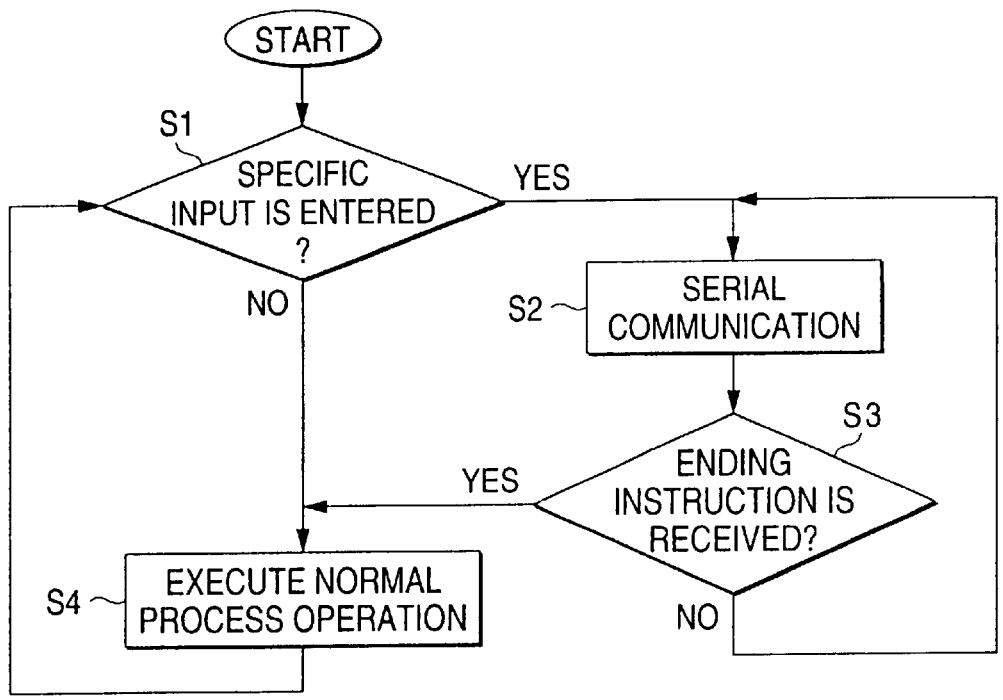
FIG. 7 is a flow chart for describing operations executed when the operation mode is advanced from the normal mode to the test mode.
Figure 8:
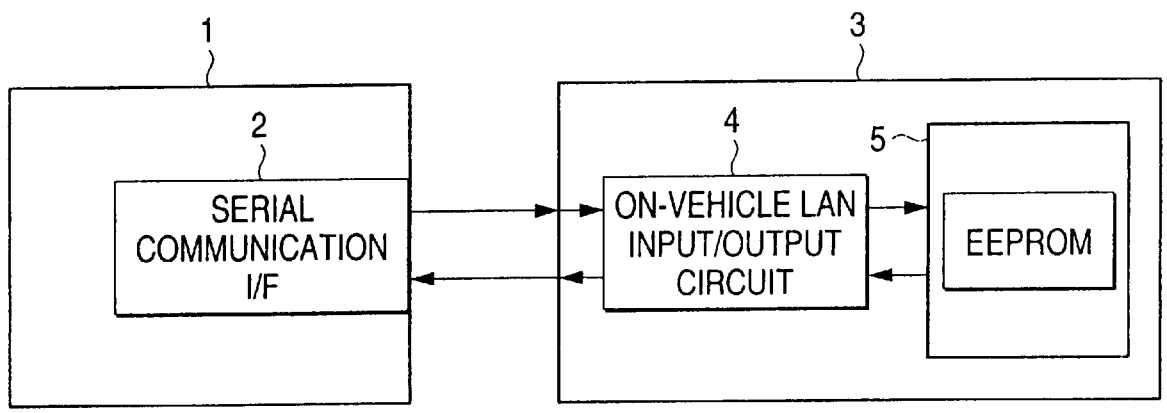
FIG. 8 is the diagram for schematically indicating one example of the conventional method for writing the data into the non-volatile memory employed in the on-vehicle electronic unit.

Then, at a step S1 shown in FIG. 7, when the microcomputer 17 once confirms the execution of the specific input based upon the signal entered via the ignition switch input circuit 11 of the electronic unit 3, the present mode processed in the microcomputer 17 is switched into "data writing mode" at a step S2. Then, such a serial communication signal (instruction frame) as represented in FIG. 3, the table 1, and the table 2 is transmitted from the test apparatus 1 to the electronic unit 3. At will be discussed later, the data writing operation to the non-volatile memory 6 is carried out.

In this case, the microcomputer 17 produces a response frame (see FIG. 5, table 3 and table 4) in response to the instruction frame, and then returns this response frame via, for example, the dome lamp circuit 18 to the serial communication input/output interface 32 of the test apparatus 9. As indicated in the table 3 and the table 4, both the content (ID1: table 3) of the data written into the non-volatile memory 6, and the serial No. (DATA1: table 4) functioning as the data stream are stored into this response frame, and then the resultant response frame is outputted from the microcomputer 17.

Now, in such as case that "an instruction frame request of ending write mode" defined in the bottommost of the table 1 is contained in the serial communication signal sent from the test apparatus 9, the microcomputer 17 executes the ending instruction at the step S3, and then switches the present mode "data writing mode" into the "normal more". Then, the process operation is advanced to a step S4. At this step S4, the microcomputer 17 receives instructions which imply the original operations of the switches 2*a* and 2*f*, and then controls the output circuits 18 to 22 based upon these instructions so as to perform the normal process operations such as the window up/down operations and the door locking operations at the respective loads 23*a* to 23*c*.

On the other hand, in the case that an instruction frame other than "request for ending of write mode" described in the bottommost instruction of the table 1 is received from the serial communication signal sent from the test apparatus 9, the process operations defined at the steps S2 and S3 are repeatedly carried out.

The test apparatus 9 confirms such a fact that the data has been written into the non-volatile memory 6 employed in the electronic unit 3 under normal condition based upon the response frame sent from the electronic unit 3, and thereafter the process operation is accomplished. Concretely speaking, the test apparatus 9 judges as to whether or not an instruction frame sent from the test apparatus 1 to the electronic unit 3 is made coincident with a response frame received from the electronic unit 3. If these instructions are made coincident with each other, then the test apparatus 9 can judge that the data has been written into the non-volatile memory under normal condition. It should be understood that this judgment can be established when both the instruction frame and the response frame own the same forms as represented in the table 1 to the table 4, whereas when the data are produced by using different forms, the test apparatus 9 may judge these frames based upon a preselected judgment logical idea.

As previously explained, in accordance with this embodiment mode, since the data is written into the non-volatile memory 6 by way of the serial communication system while directly using the presently available input circuits 11 to 16 and also output circuits 18 to 22 without any modification in such a case that the arbitrary data is stored from the test apparatus 1 into the non-volatile memory 6 employed in the electronic unit 3 even as to the electronic unit 3 which is not adapted to the on-vehicle LAN, there is no need to newly prepare the interface circuit dedicated to the data writing operation. As a consequence, it is possible to avoid the bulky electronic unit 3 and also high cost thereof.

Furthermore, since the serial number of product, the test date/time of this product, and the test OK/NG result thereof are written when the product is tested/shipped, there is such a merit that the products can be readily managed in the lot unit.

In accordance with the present, the data writing method for the non-volatile memory is carried out by outputting a specific input signal with respect to the existing input circuits of the electronic unit from the test apparatus so as to switch an operation mode of the control circuit employed in the electronic unit to a data writing mode for writing the data into the non-volatile memory; outputting a predetermined write instruction command to the input circuits from the test apparatus when the control circuit is operated in the data writing mode; transmitting arbitrary data subsequent to the write instruction command from the test apparatus to the input circuits, the arbitrary data being wanted to be written into the non-volatile memory employed in the electronic unit; and confirming as to whether or not the data is written into the non-volatile memory employed in the electronic unit in response to the write instruction command in the test apparatus side. As a consequence, while the presently available input circuits and also output circuits are directly utilized without newly setting the interface circuit exclusively employed on the side of the electronic unit, these input circuits and output circuits can be readily tested.

Therefore, it is possible to avoid the bulky electronic unit 3 and also high cost thereof.

Furthermore, since the serial number of product, the test date/time of this product, and the test OK/NG result thereof are written when the product is tested/shipped, there is such a merit that the products can be readily managed in the lot unit.

What is claimed is:

1. A method for writing data into a non-volatile memory employed in an on-vehicle electronic unit having a plurality of input circuits connected to a plurality of external switches, into which operation signals of the respective external switches are entered; a plurality of output circuits for outputting predetermined output signals to an external unit; a junction point between the external switches and the plurality of input switches and a control circuit for controlling said respective output signals derived from said plural output circuits in response to said respective operation signals entered via said plural input circuits, said control circuit having the non-volatile memory therein, said data writing method comprising the steps of:

connecting a test apparatus to said on-vehicle electronic unit through a serial connection to the preexisting junction point so that the testing apparatus has a serial communications interface that communicates through an existing serial connection between the plurality of the external switches and the plurality of input circuits that is employed to send normal mode operation signals;

outputting a specific input signal through the existing input circuits of said electronic unit from said test apparatus so as to switch an operation mode of said control circuit employed in said electronic unit to a data writing mode for writing the data into said non-volatile memory;

outputting a predetermined write instruction command comprising an instruction frame to said input circuits from said test apparatus when said control circuit is operated in the data writing mode;

sending a response frame from a microcomputer of the on vehicle electronic unit to the testing apparatus via the respective output circuit;

transmitting arbitrary data subsequent to said write instruction command from said test apparatus to said input circuits, said arbitrary data being wanted to be written into said non-volatile memory employed in said electronic unit;

sending an instruction frame from the testing apparatus requesting the end of data write mode when the transmitting operation is complete and, in response, the microcomputer returning to the normal mode;

confirming as to whether or not said data is written into said non-volatile memory employed in said electronic unit in response to said write instruction command in said test apparatus based upon the output signals derived from said output circuits after said ending the data write mode.

2. A method for writing data into a non-volatile memory employed in an on-vehicle electronic unit as claimed in claim 1 wherein all steps are executed when said electronic unit is shipped.

* * * * *